(12) United States Patent
Liao et al.

(10) Patent No.: US 7,272,043 B2
(45) Date of Patent: Sep. 18, 2007

(54) OPERATION METHODS FOR A NON-VOLATILE MEMORY CELL IN AN ARRAY

(75) Inventors: Yi Ying Liao, Sijhih (TW); Chih Chieh Yeh, Taipei (TW); Wen Jer Tsai, Hualien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/020,269

(22) Filed: Dec. 27, 2004

(65) Prior Publication Data

US 2006/0140000 A1  Jun. 29, 2006

(51) Int. Cl.
*G11C 11/34* (2006.01)
*G11C 16/06* (2006.01)

(52) U.S. Cl. .......................... 365/185.18; 365/185.17; 365/185.25

(58) Field of Classification Search ........... 365/185.18, 365/185.17, 185.14, 185.24, 185.25, 185.28
See application file for complete search history.

(56) References Cited

U.S. PATENT DOCUMENTS

| | | | |
|---|---|---|---|
| 6,411,548 B1 * | 6/2002 | Sakui et al. | 365/185.17 |
| 6,616,070 B1 * | 9/2003 | Kunkulagunta | 239/533.12 |
| 6,825,084 B2 * | 11/2004 | Ogura et al. | 438/262 |
| 6,894,924 B2 * | 5/2005 | Choi et al. | 365/185.01 |
| 2004/0145024 A1 * | 7/2004 | Chen et al. | 257/390 |
| 2006/0049448 A1 * | 3/2006 | Yeh | 257/315 |

\* cited by examiner

*Primary Examiner*—Anh Phung
*Assistant Examiner*—Toan Le
(74) *Attorney, Agent, or Firm*—Akin Gump Strauss Hauer & Feld LLP

(57) ABSTRACT

A method of reducing gate disturb in a charge-trapping layer memory cell by applying different Vpass voltages to different sides of a selected wordline. A higher Vpass voltage is used to pass higher source/drain voltage and a lower Vpass voltage is used to pass a lower source/drain voltage. By controlling the Vpass voltages on different sides of a selected wordline, it is possible to reduce a vertical field that is established in a gate region when the Vpass voltages are applied. A reduced vertical field results in suppressed gate disturb. The method also includes a novel bit-line biasing scheme that may further reduce the vertical field and thereby may further suppress gate disturb, particularly in an array of memory cells.

37 Claims, 11 Drawing Sheets

OPERATION METHODS FOR A NON-VOLATILE MEMORY CELL IN AN ARRAY

BACKGROUND

1. Field of the Invention

The present invention relates generally to non-volatile memory devices. More particularly, the present invention relates to improved methods of operating a NAND array comprising a plurality of localized trapped charge memory cell structures capable of storing multiple bits per cell.

2. Background of the Invention

Recently, a new type of memory cell, known as PHINES (Programming by hot Hole Injection Nitride Electron Storage) and which is described in detail in C. C. Yeh et al., "PHINES: A Novel Low Power Program/Erase, Small Pitch 2-Bit per Cell Flash Memory," IEDM, p. 931, 2002, has been introduced. FIG. 1 depicts such a PHINES memory cell or transistor 10 that is implemented in and on substrate 8. Memory cell 10 comprises source and drain regions 22, 24, as is conventional in a typical MOSFET structure, and a channel 12 disposed between source and drain regions 22, 24. Overlying channel 12 is a unique charge-trapping structure 11, which comprises a charge-trapping nitride layer 16 (e.g., silicon nitride) disposed between two oxide isolation layers 14, 18 (e.g., silicon oxide). Each memory cell 10 further comprises a gate electrode 20 that overlies the charge-trapping structure 11, and the source and drain regions 22, 24 each has a corresponding electrode, as shown in FIG. 1.

As is explained more fully below, by properly manipulating the relative voltages among substrate 8, source and drain regions 22, 24 and gate 20, it is possible, to erase, store (or program) and read two separate bits of information in each memory cell 10. FIGS. 2A-2C illustrate how memory cell 10 can be completely erased and how two separate bits can be separately programmed. To erase both bits (designated as right bit "bit-R", and left bit "bit-L"), as shown in FIG. 2A, a negative voltage (e.g., −8V) is applied to gate 20 and positive voltages (e.g., 10 V) are applied to each of substrate 8, and source and drain regions 22, 24, such that electrons from the gate are injected substantially throughout nitride charge-trapping layer 16. As a result, charge-trapping layer 16 is effectively devoid of any holes.

To program bit-R of memory cell 10 (i.e., to trap holes toward the right hand side of charge-trapping layer 16), source region 22 is grounded, a positive voltage (e.g., 5 V) is applied to drain region 24 and a negative voltage (e.g., −5 V) is applied to gate 20. This biasing state causes hot hole injection to occur into nitride charge-trapping layer 16 in a region toward a drain-side of layer 16. Due to the nature of the nitride material, charge-trapping layer 16 is able to trap charges so that injected charges will not distribute evenly in the charge-trapping layer 16, but will instead be localized in a region of charge-trapping layer 16 near the charge injection side. Consequently, it is possible to program (i.e., positively charge) only one side of the charge-trapping layer at a time.

To program bit-L of memory cell 10, the voltages on source and drain regions 22, 24 are reversed (as compared to bit-R programming), as shown in FIG. 2C. Of course, although not shown, both bit-R and bit-L can be simultaneously programmed, or programmed successively such that both bit-R and bit-L are in a programmed state at the same time.

To read bit-L, for example, substrate 8 is either grounded or can be biased with a positive voltage, and a sensing voltage (e.g., 2-3 V) is applied to gate 20. A small positive voltage (e.g., 1.5-2 V) is then applied to drain 24, and source 22 is grounded. With the above voltages applied, the current in the source is sensed. (According to an alternative variation, the current in the drain is sensed.) Generally, the current in the drain is essentially zero if bit-L is not programmed. If bit-L is programmed, then a measurable current is observed in the drain. To be more precise, a "threshold" current is defined such that current is said to be present when the value of current exceeds the threshold value. When current does not exceed the threshold, then the current is declared to be zero. A typical value for threshold current is about 10 μA. The sensed value of current is compared with the threshold value. If the current does not exceed the threshold, a decision is made declaring that bit-L is not programmed. If the current exceeds the threshold, a decision is made declaring that bit-L is programmed.

To read bit-R, the small positive voltage (1.5-2 V) is applied to the source, while the drain is grounded and current is sensed.

FIGS. 3A and 3B show how a plurality of memory cells 10 can be arranged in a NAND string. Programming and reading are accomplished substantially the same way as described above, but instead of voltages being applied directly to the source and drain regions of a particular cell of interest, these voltages are instead applied to the ends of the given string (or bit-line) in which the cell of interest is located. The above-described appropriate gate voltage is applied to a wordline (WL) conductor, which is in electrical communication with the gate of the selected cell. Simultaneously, a Vpass voltage is applied to the wordlines (gates) of all other memory cells. The Vpass voltage effectively turns on the underlying transistor, allowing current to easily pass along the entire NAND string and for voltages applied at either end of the string effectively to be applied at the source and drain sides of the selected memory cell.

When operating a NAND string according to this manner, an undesirable phenomenon called "gate disturb" has been observed. Generally speaking, gate disturb is the undesirable injection of electrons into the nitride charge-trapping layer of a PHINES memory cell that corrupts the integrity of stored bits. As shown in FIG. 4, the higher the gate voltage (Vpass) and the longer the time such gate voltage (Vpass) is applied, a corresponding increase in Vt (the threshold voltage above which channel current is observed) is observed. This Vt "shift-up" is caused by the existence of a high vertical field that causes electrons to be injected into the nitride layer, resulting in decreased transport electrons in the channel. Also as shown by FIG. 4, more severe gate disturb is found as Vg (e.g., Vpass) increases (since the vertical field is larger) and the time over which Vg (or Vpass) is applied.

A similar gate disturb phenomenon has been observed when the NAND strings of FIGS. 3A and 3B are combined into a NAND array like that shown in FIG. 5. This figure shows that two different levels of gate disturb occur, one higher A and one lower B in the read operation, depending on the relative location of a cell with respect to the memory cell of interest.

Similarly, in the program operation of a NAND array as shown in FIG. 6, three different levels C, D, and E of gate disturb have been observed, with C representing higher gate disturb, and D and E representing lower levels of gate disturb. Note that one of the bit-lines in FIG. 6 shows two different biasing levels. When a biasing of 0 and 5 volts is applied to source and drain regions of a selected cell, one side of the selected cell is programmed (bit-R or bit-L), and when a biasing scheme of 0 and 3.5 volts is applied to source and drain regions of a selected cell, both bit-R and bit-L are not programmed.

In view of the above-described gate disturb problem, there is a need to improve the reliability of PHINES-type memory cells arranged in NAND strings and NAND arrays.

BRIEF SUMMARY OF THE INVENTION

In accordance with aspects of the present invention, a method of operating a plurality of memory cells each comprising a charge trapping layer is provided. The memory cells are selectable via bit-lines and wordlines. A first Vpass voltage is applied to non-selected wordlines on one side of a selected wordline, and a second Vpass voltage, different from the first Vpass voltage, is applied to non-selected wordlines on another side of the selected wordline. In one embodiment, the first Vpass voltage is higher than the second Vpass voltage in read and program operations, and is applied to pass a higher source/drain voltage that is applied to one end of a bit-line in which the selected memory cell is located, while a lower source/drain voltage is applied to another end of the bit line in which the selected memory cell is located.

In accordance with one implementation, in a read operation, bit-lines in which the selected memory cell is not located are charged to approximately 0 volts. Alternatively, in a read operation, bit-lines in which the selected memory cell is not located are charged to a non-zero bias voltage, e.g., approximately 2 volts.

In accordance with still another implementation, in a program operation, bit-lines in which the selected memory cell is not located are charged to approximately 0 volts. Alternatively, in a program operation, bit-lines in which the selected memory cell is not located are charged to a non-zero bias voltage, e.g., approximately 2 volts.

In one example, the memory cells may be multi-bit memory cells.

In some examples consistent with the present invention, gate disturb in read and program operations of a NAND array of multi-bit charge trapping layer memory cells can be suppressed.

These and other features of the present invention, along with their attendant advantages, will be more fully appreciated upon a reading of the following detailed description in conjunction with its associated drawings.

DETAILED DESCRIPTION OF THE INVENTION

Figure 1:
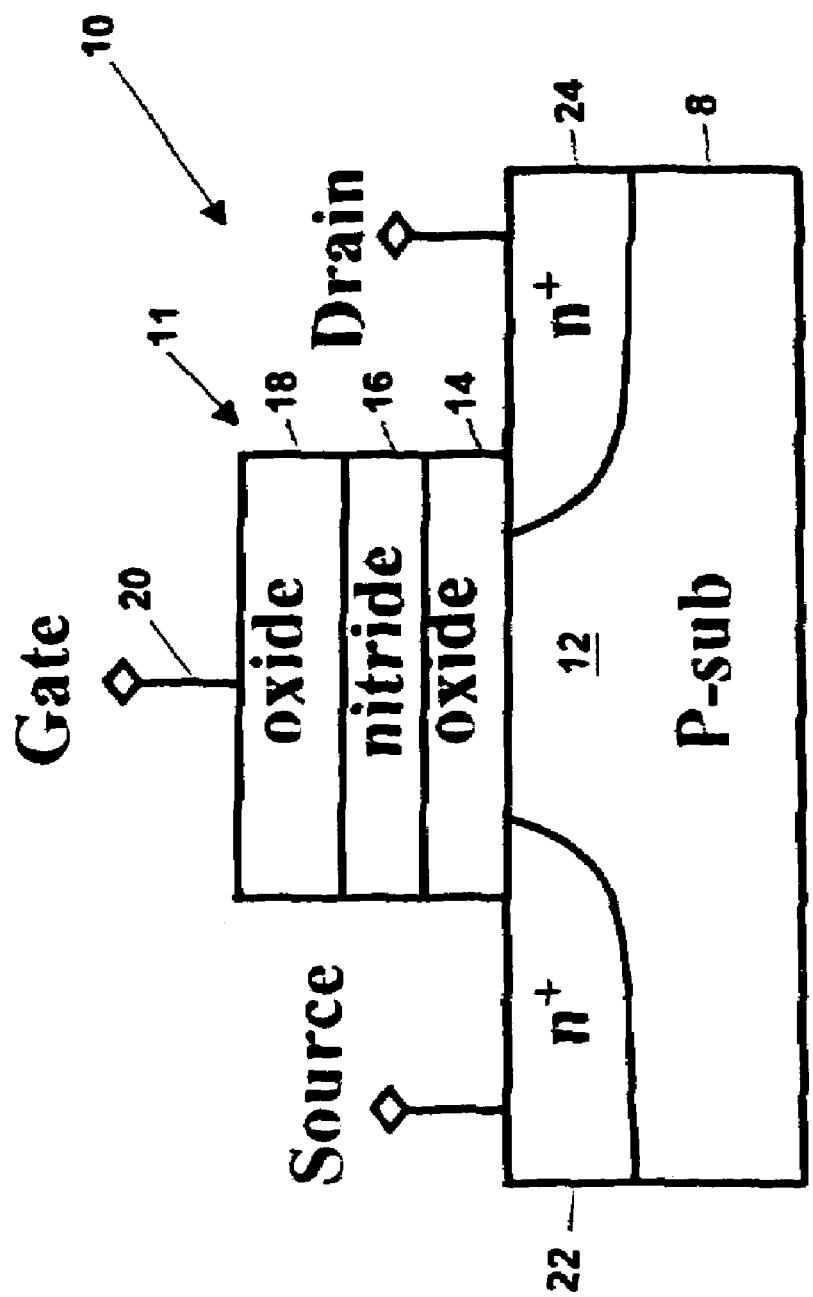
FIG. 1 shows a known PHINES-type memory cell.
Figures 2A, 2B, 2C:
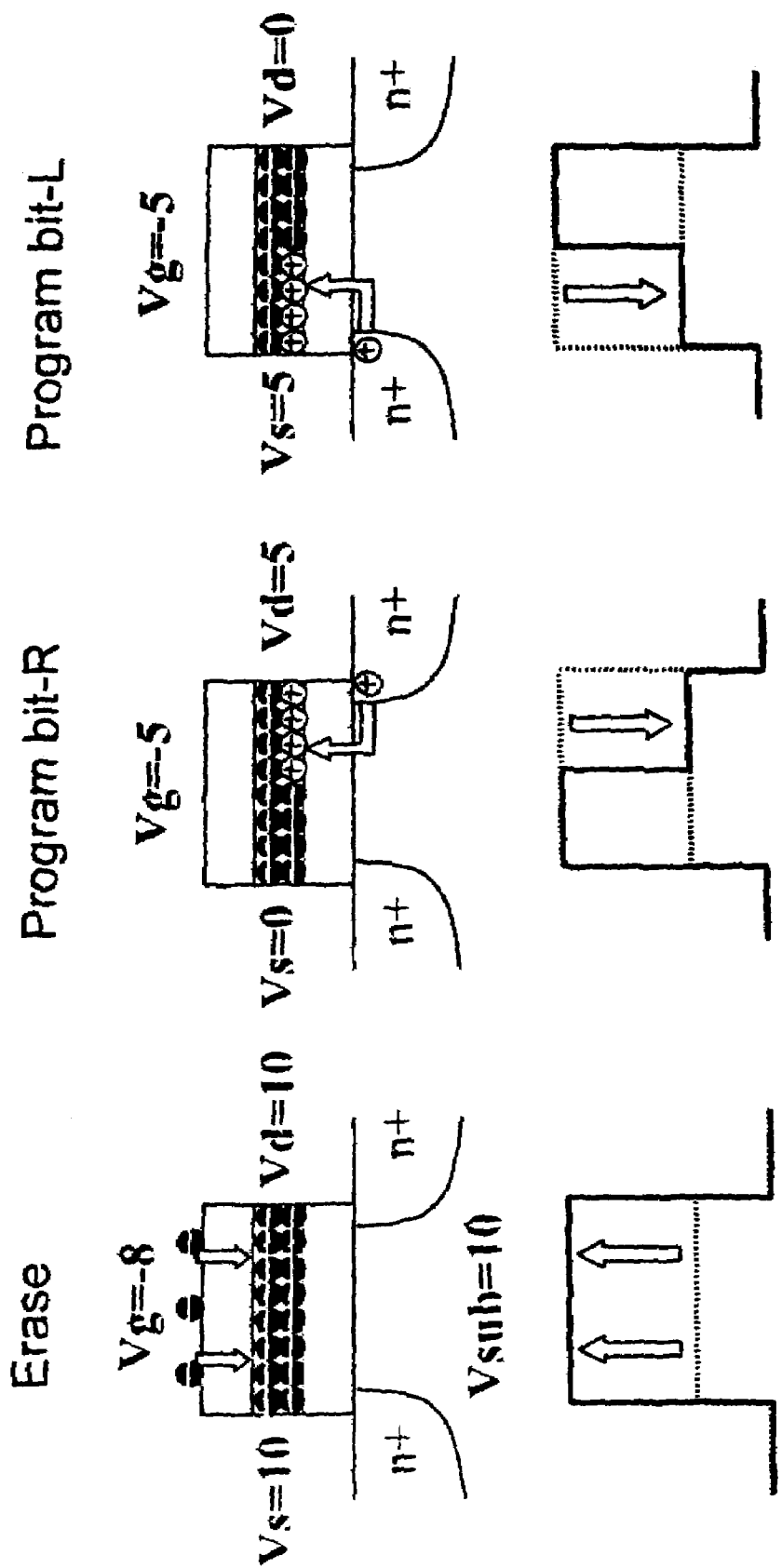
FIGS. 2A-2C show how a known PHINES-type memory cell can be erased and programmed.
Figures 3A, 3B:
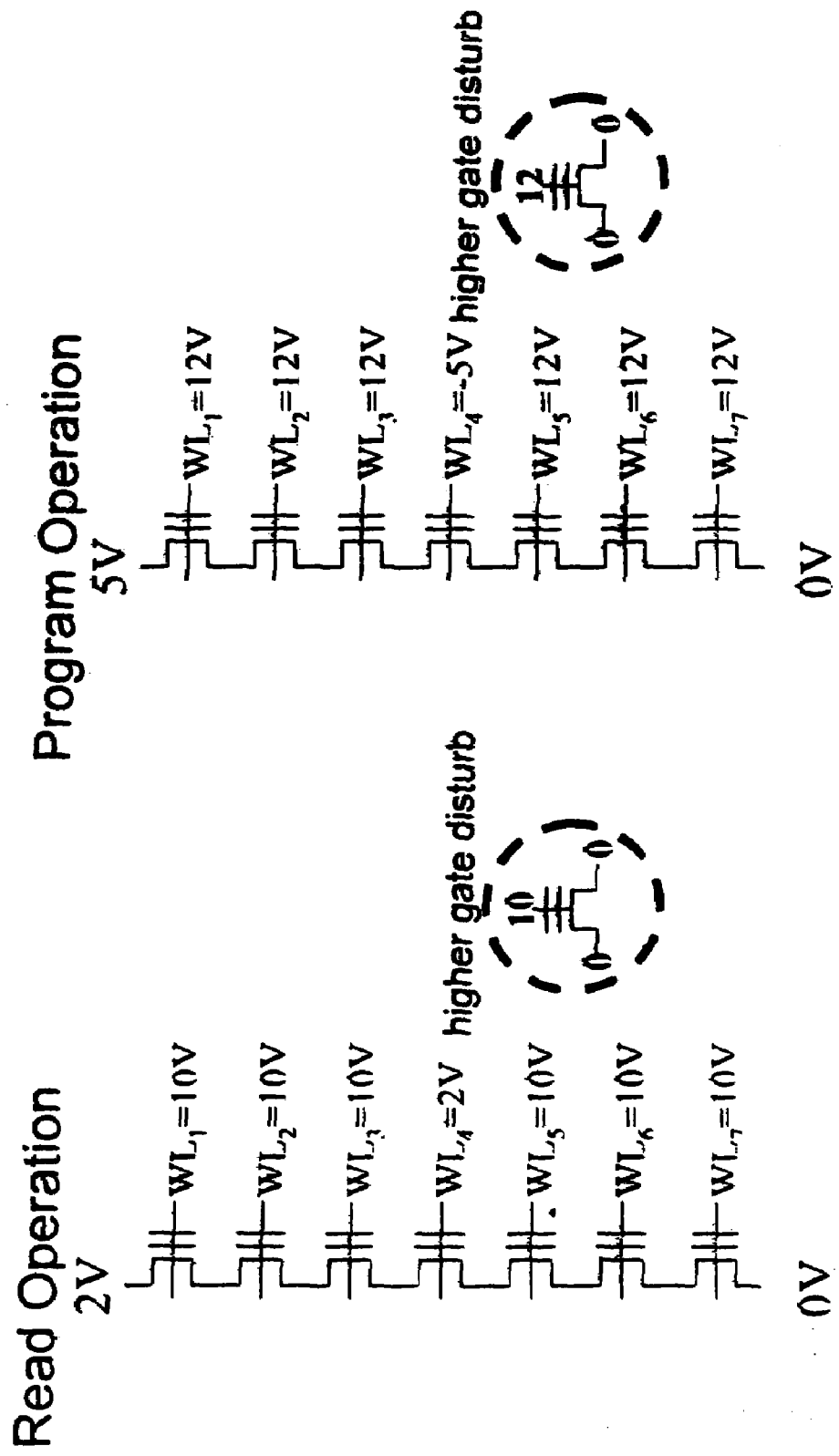
FIGS. 3A and 3B show that gate disturb is observed during read and program operations of a conventional NAND string comprising a plurality of PHINES-type memory cells.
Figure 4:
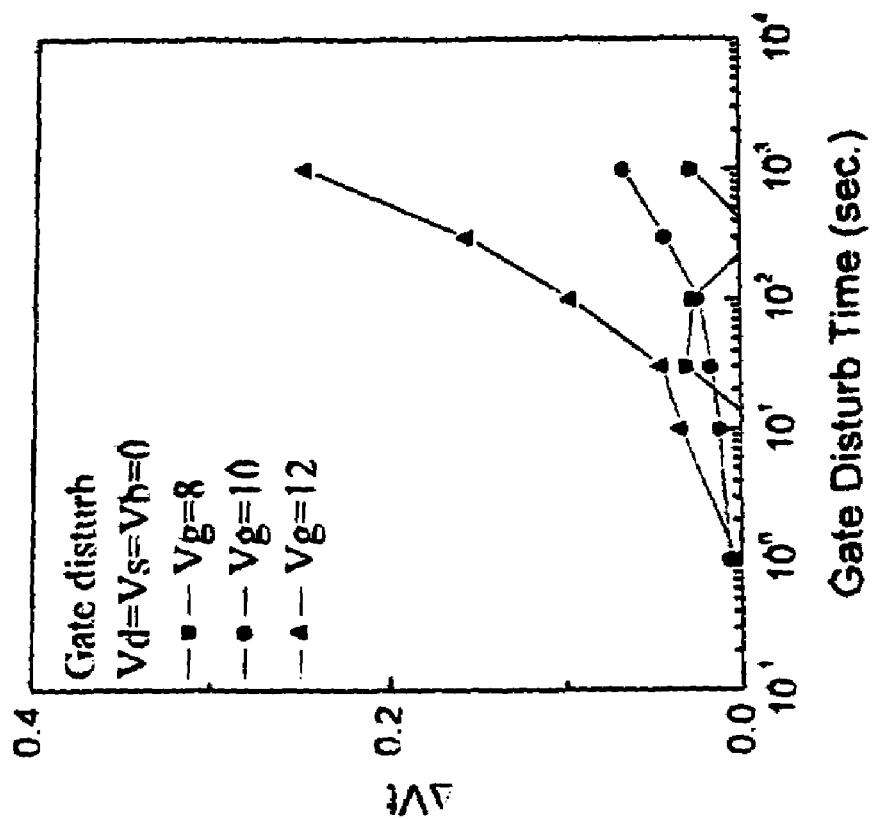
FIG. 4 is a graph plotting the increase in threshold voltage with increasing gate to source/drain biasing.
Figure 5:
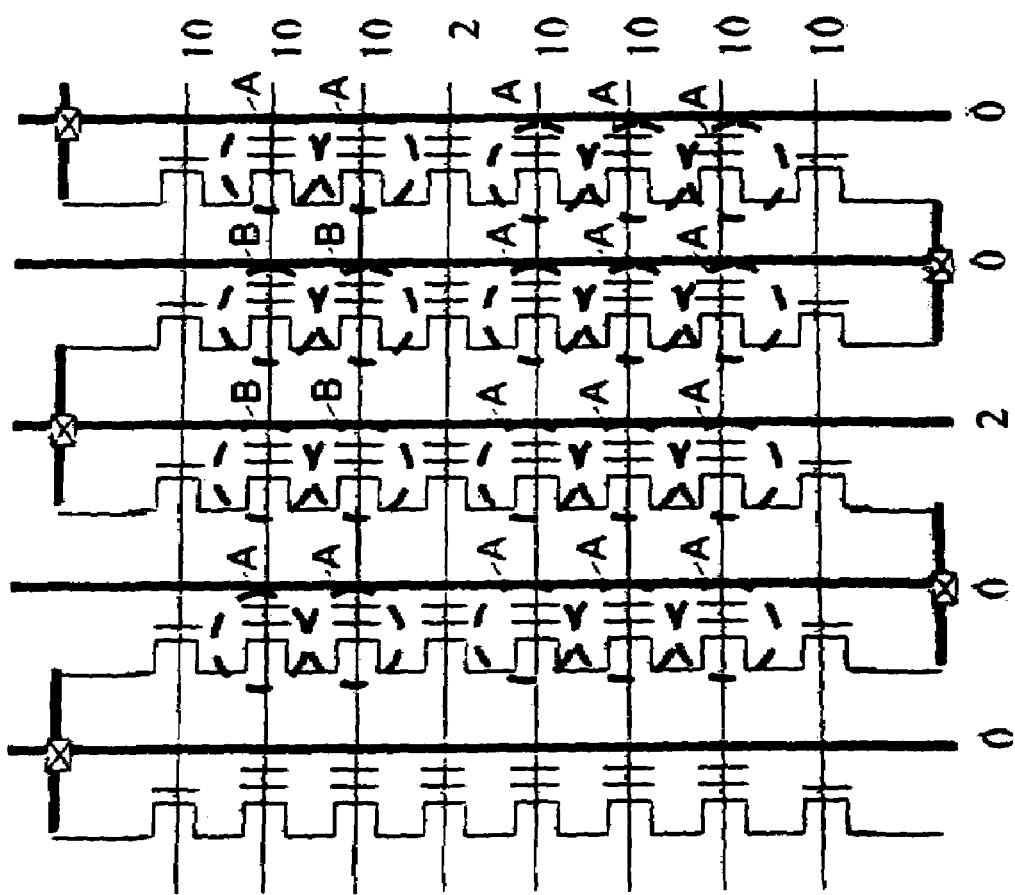
FIG. 5 shows location and severity of gate disturb during a read operation of a conventional NAND array comprising a plurality of PHINES-type memory cells.
Figure 6:
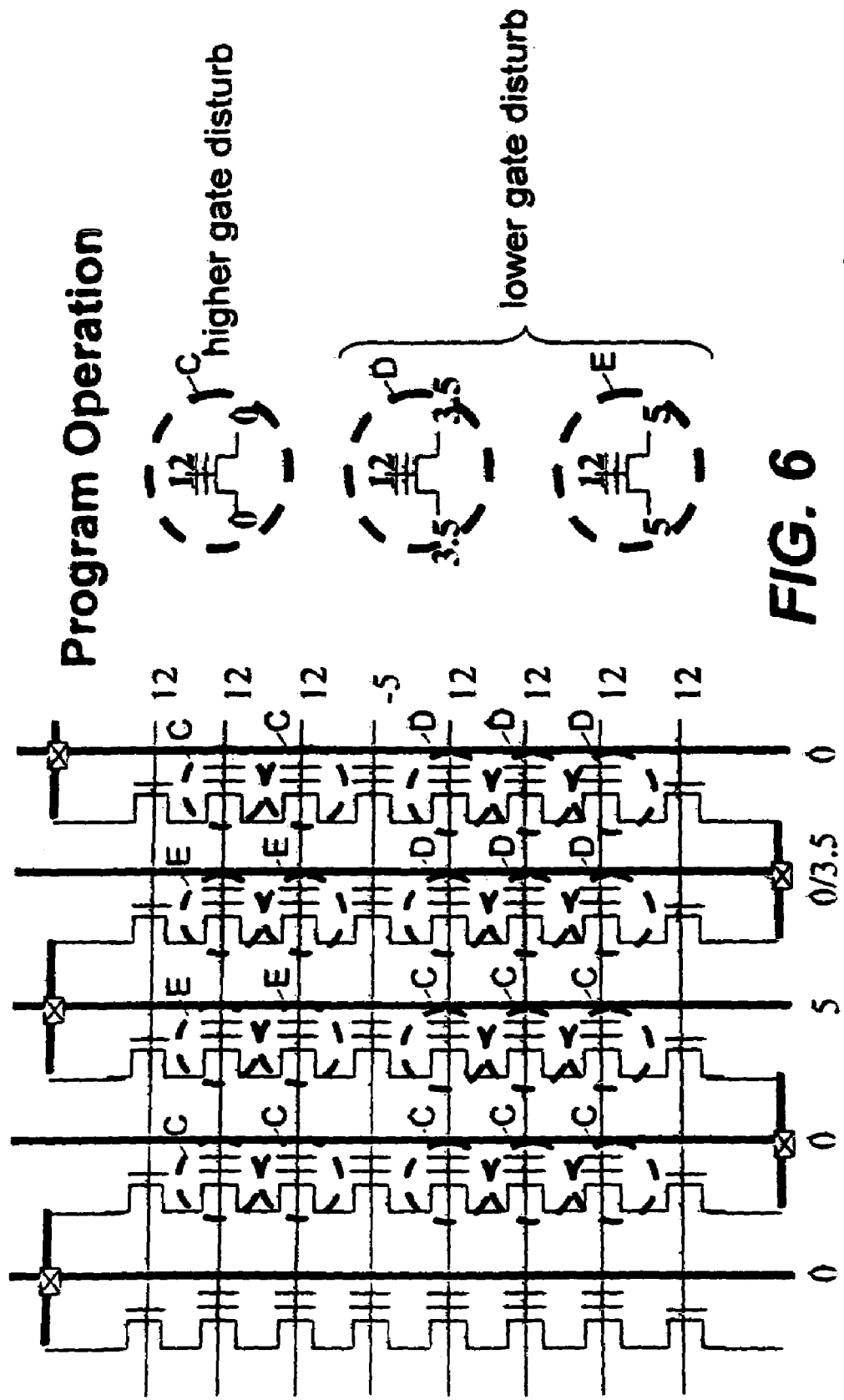
FIG. 6 shows location and severity of gate disturb during a program operation of a conventional NAND array comprising a plurality of PHINES-type memory cells.
Figure 7:
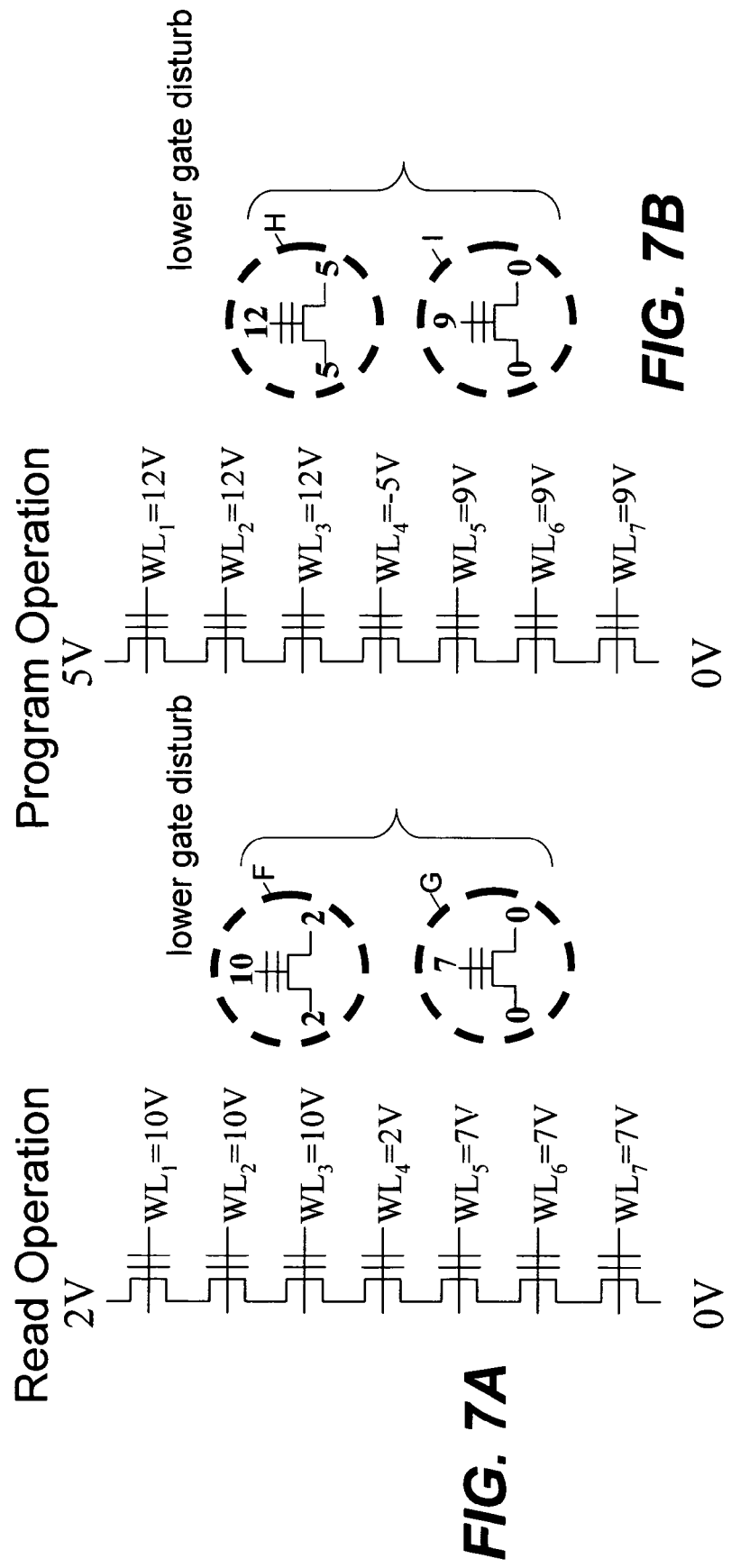
FIGS. 7A and 7B show biasing methods for NAND strings comprising PHINES-type memory cells in the read and program operation according to an embodiment of the present invention.

The gate disturb problems described above in connection with the read and program operations of PHINES-type memory cells arranged in strings and arrays may be overcome, in accordance with the present invention, by applying different Vpass voltages on different sides of a wordline that contains a selected memory cell. FIGS. 7A and 7B depict, respectively, the application of different Vpass voltages in the read and program operations in accordance with an embodiment of the present invention, resulting in lower overall gate disturb in non-selected cells. More specifically, instead of applying to all wordlines, other than the selected wordline, the same Vpass voltage of, e.g., 10 V (see FIG. 3A) during the read operation, a first Vpass voltage of 10 V is applied to wordlines on one side of selected memory cell and a second Vpass voltage, different from the first Vpass voltage (in this case 7 V), is applied to wordlines on the other side of selected memory cell. As can be seen in the circled single cell representations F, G in FIG. 7A, the effective potential between the gate and source/drain regions is reduced to at most 8 volts in one example, whereby the vertical field in the region of the gate and channel of a given memory cell is reduced, such that gate disturb is reduced. Generally speaking, in accordance with the present invention, higher Vpass voltages (e.g., 10±2 V) can be used to "pass" higher bit-line voltages, and lower Vpass voltages (e.g., 7±2 V) can be used to pass lower or zero bit-line voltages. By implementing such a biasing methodology, it is possible to minimize undesirable gate disturb.

Similar Vpass manipulation can be performed during a program operation, as shown in FIG. 7B. Here, unlike the prior art where a typical Vpass of 12 V is applied to all non-selected wordlines in the program operation, a lower Vpass (e.g., 9±2 V) is applied to the wordlines passing 0 V, and a Vpass of 12±2V is applied to wordlines passing 5 V. As can be seen from the circled single cell representations H, I in FIG. 7B, the effective potential between the gate and source/drain regions is reduced, whereby the vertical field in the region of the gate and channel of a given memory cell is reduced such that gate disturb is reduced.

Figure 8:
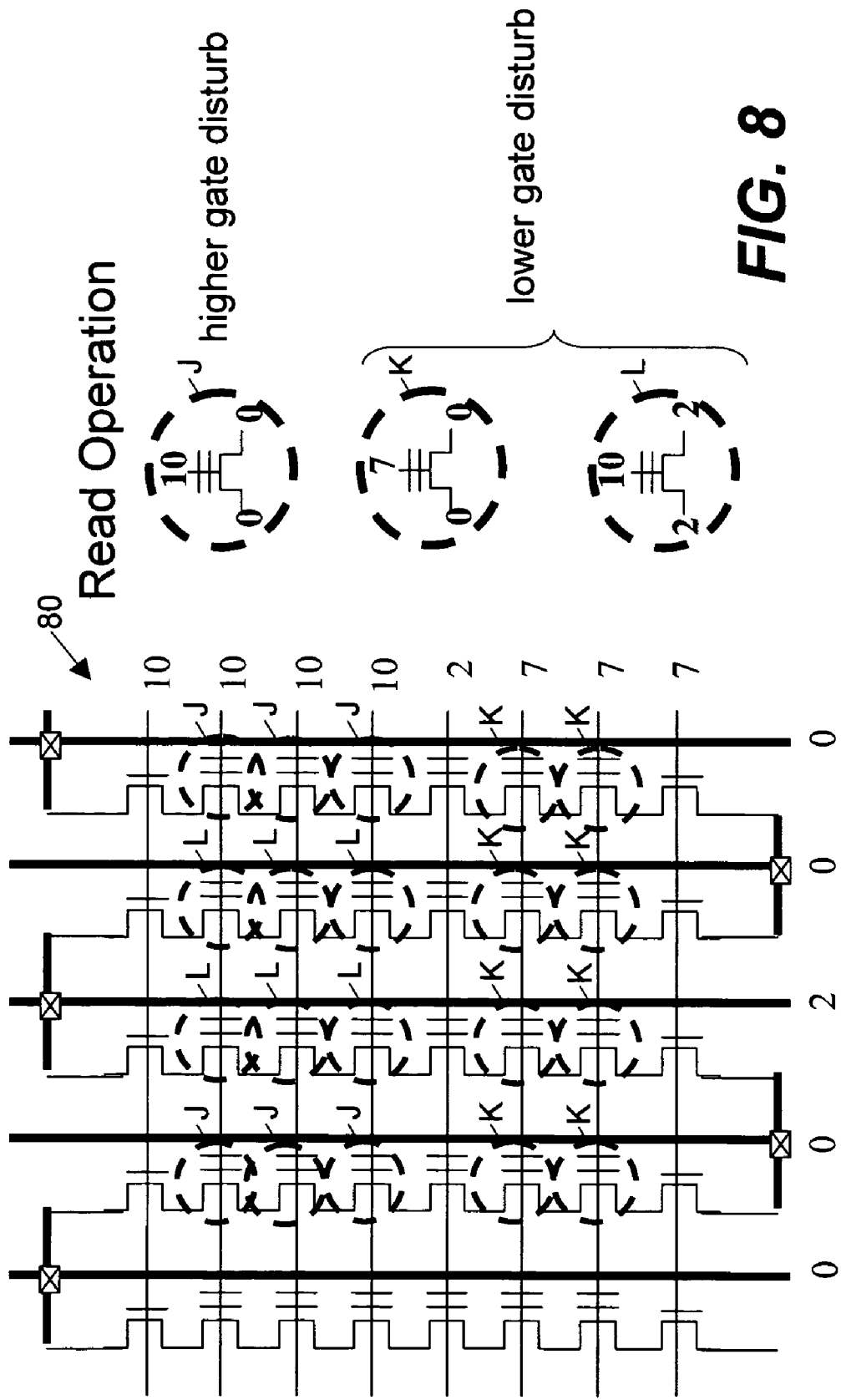
FIG. 8 shows a biasing method for a NAND array comprising PHINES-type memory cells in the read operation according to an embodiment of the present invention.

FIG. 8 shows how the principles of the present invention can also be applied to a read operation in a NAND array 80 of PHINES-type memory cells. In the conventional read operation in a NAND array, selected bit-lines are charged to 2 V and 0 V, while the non-selected bit-lines are charged to 0 V. As can be seen in FIG. 8, even when different Vpass voltages (10 V and 7 V) are applied to different sides of the selected wordline, there may be many cells J (in the non-selected bit-lines) that still experience gate disturb, since a relatively significant vertical field remains for these particular cells. On the other hand, gate disturb is improved for other cells K, L.

Figure 9:
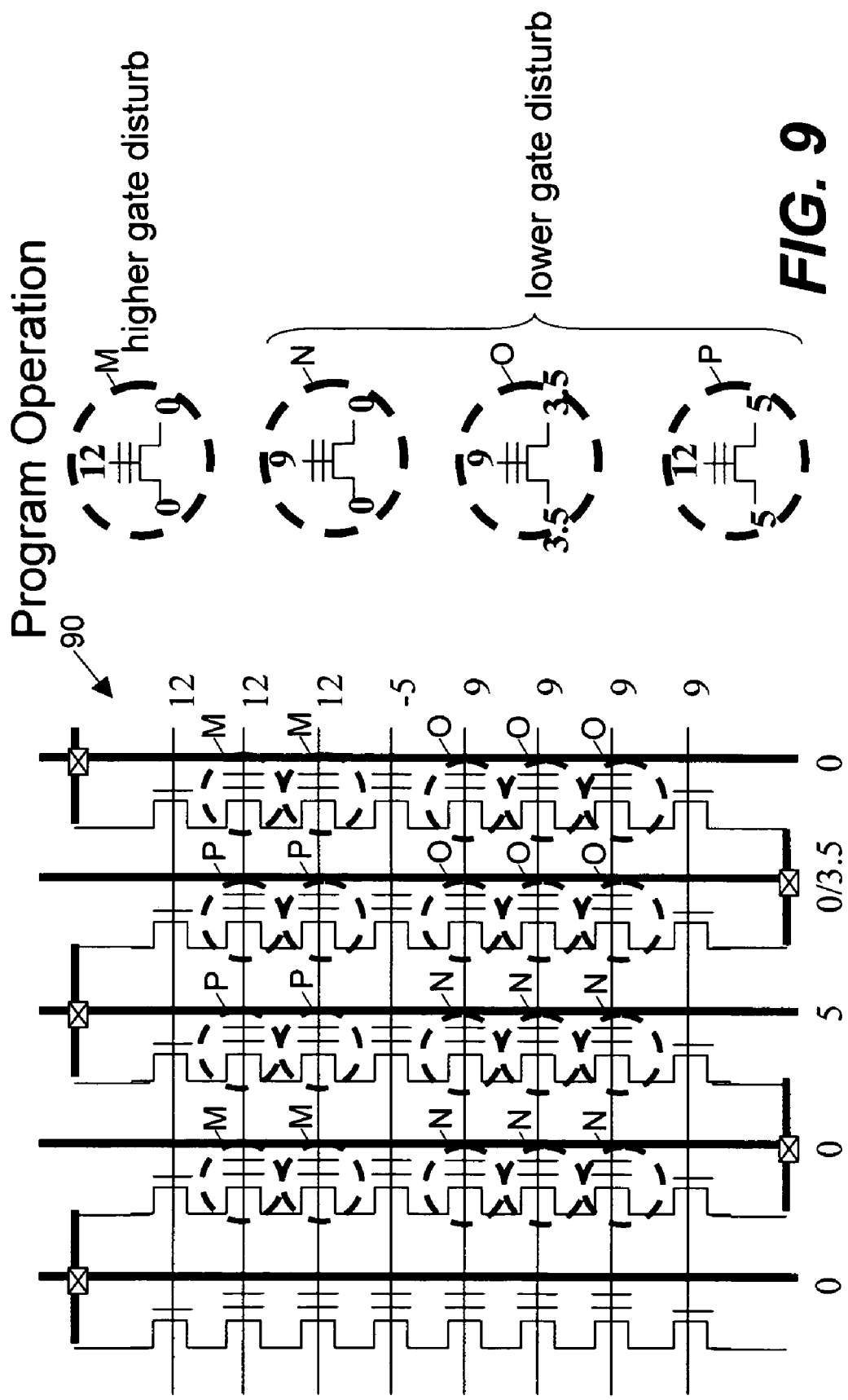
FIG. 9 shows a biasing method for a NAND array comprising PHINES-type memory cells in the program operation according to an embodiment of the present invention.

FIG. 9 depicts a similar situation, but as it relates to a program operation in a PHINES-type NAND array 90. In accordance with a program operation in the prior art, selected bit-lines are charged to 5 V, 3.5 V and 0V, and the non-selected bit-lines are charged to 0 V. In accordance with the instant embodiment of the present invention, gate disturb in the program operation can be suppressed by applying different Vpass voltages on different sides of the selected wordline. Indeed, the biasing conditions experiences by memory cells N, O and P, will result in lower gate disturb. Unfortunately, some cells, namely cells M, will still experience relatively high vertical fields such that gate disturb might still be problematic.

Figure 10:
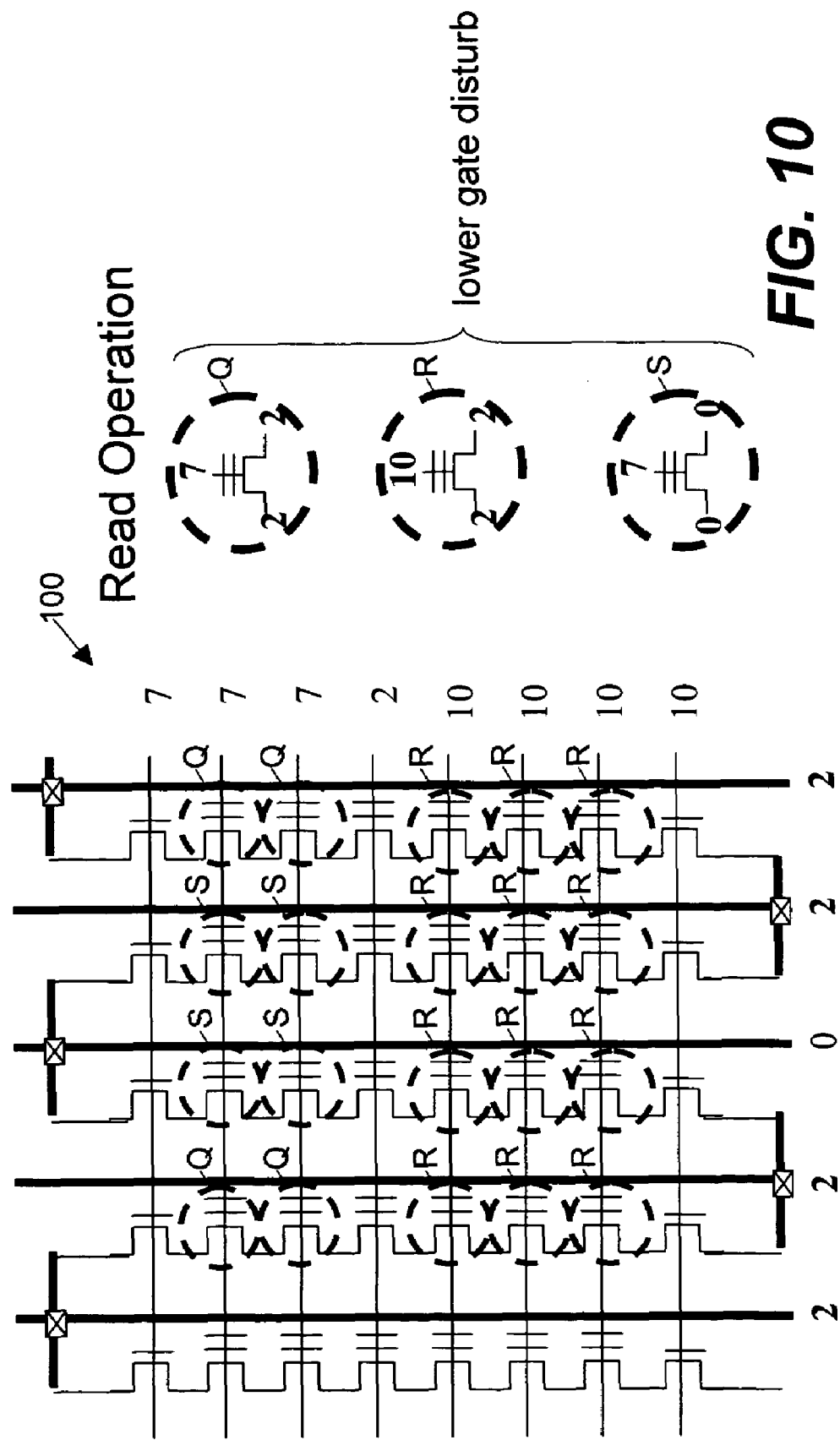
FIG. 10 shows a biasing method for a NAND array comprising PHINES-type memory cells in the read operation according to another embodiment of the present invention.

FIG. 10 shows a biasing method for a NAND array 100 comprising PHINES-type memory cells in the read operation according to another embodiment of the present invention, and which addresses the problems associated with some cells (i.e., J cells) in the previously-described embodiment. As explained above in describing the embodiment of FIG. 8, non-selected bit-lines are charged to 0 V, which for higher Vpass voltages (e.g., 10 V) still causes higher gate disturb. In this embodiment of the present invention, non-selected bit-lines are all charged to 2 V, and the selected bit-lines are charged to 0 volts. Also, the higher and lower Vpass voltages are applied opposite to what is depicted in FIG. 8 (i.e., 10 and 7 volts, versus 7 and 10 volts, respectively). As shown by cells Q, R and S, vertical fields can be reduced throughout the array such that gate disturb can be suppressed throughout array 100.

Figure 11:
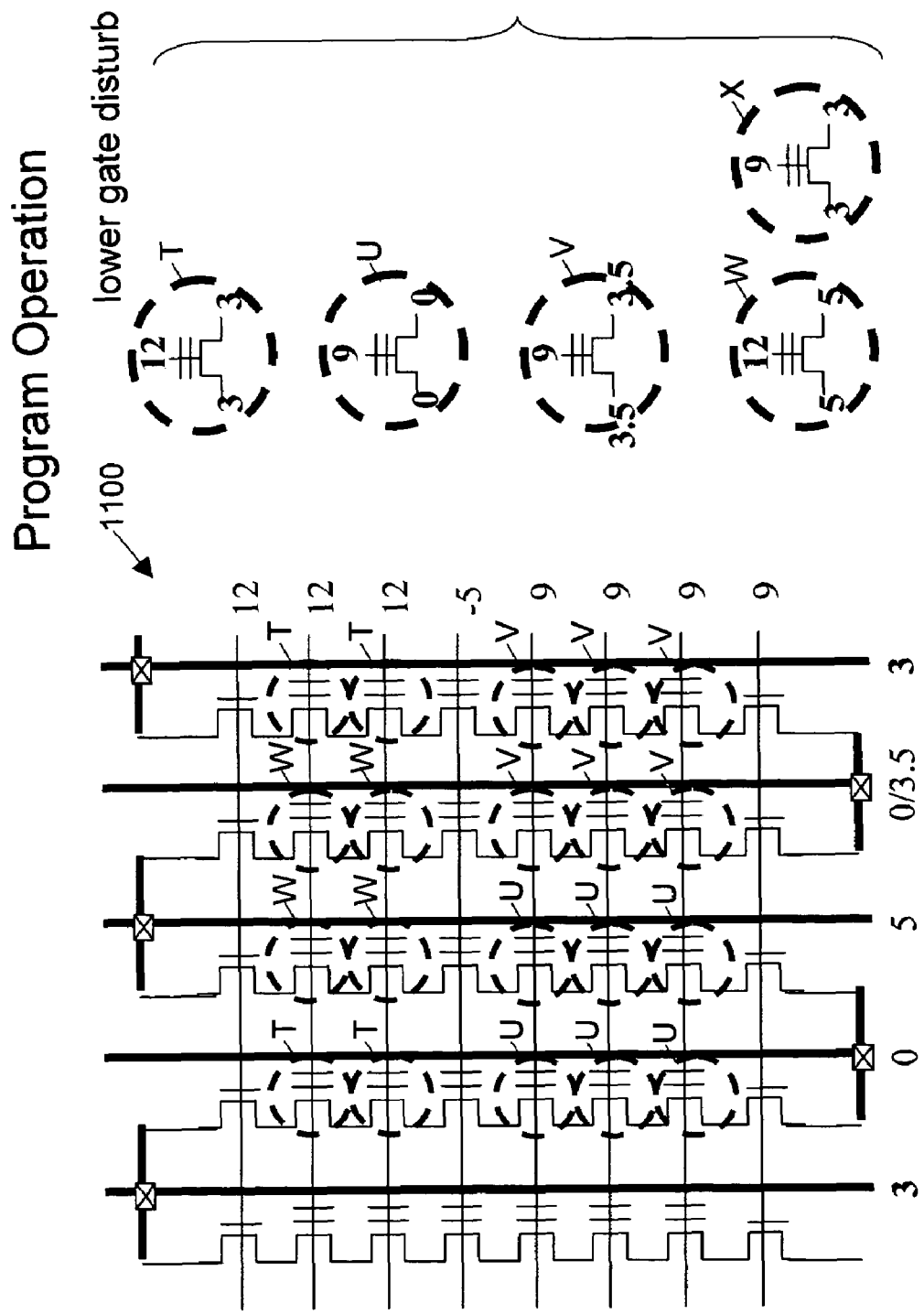
FIG. 11 shows a biasing method for a NAND array comprising PHINES-type memory cells in the program operation according to another embodiment of the present invention.

FIG. 11 shows a biasing method for a NAND array 1100 comprising PHINES-type memory cells in the program operation according to still another embodiment of the present invention. As explained with respect to FIG. 9, non-selected bit-lines are charged to 0 V. Unfortunately, while most memory cells in the array of FIG. 9 experience lower gate disturb, some of the cells (i.e., cells M) are still subject to larger vertical fields resulting in higher gate disturb. The embodiment depicted in FIG. 11 addresses this situation. In this embodiment, non-selected bit-lines are charged to 3 V (not 0 V) and the selected bit lines are charged, in the program operation, to 5 V, 3.5 V and 0 V. In this way, as depicted by cells T, U, V, W and X, the vertical field in all cells is effectively minimized, whereby undesirable gate disturb is also minimized.

As will be appreciated by those skilled in the art, the embodiments of the present invention provide a method whereby the vertical field in any given memory cell in a string or an array can be limited such that gate disturb, which occurs as a result of undesirably high vertical fields, can be suppressed. This leads to more efficient and reliable PHINES-type memory cells, or other similar multi-bit memory cells.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method of operating a plurality of memory cells each comprising a charge trapping layer, the memory cells arranged in an array and being selectable via bit-lines and wordlines, the method comprising:
identifying a wordline in which a selected memory cell is located as a selected wordline;
applying a first Vpass voltage to non-selected wordlines on one side of the selected wordline; and
applying a second Vpass voltage, different from the first Vpass voltage, to non-selected wordlines on another side of the selected wordline, wherein the different first and second Vpass voltages are applied to non-selected wordlines during a read operation and a program operation and wherein at least one bit line connects at least two drains of memory cells in neighboring rows of the array.

2. The method of claim 1: wherein the first Vpass voltage is higher than the second Vpass voltage.

3. The method of claim 2: wherein the first Vpass voltage is applied to pass a higher source/drain voltage that is applied to one end of a bit-line in which the selected memory cell is located.

4. The method of claim 2: wherein the second Vpass voltage is applied to pass a lower source/drain voltage that is applied to one end of a bit-line in which the selected memory cell is located.

5. The method of claim 2: wherein the method of operating comprises at least one of reading and programming the selected memory cell.

6. The method of claim 1, further comprising applying to the selected wordline a voltage consistent with programming the selected memory cell.

7. The method of claim 1, further comprising applying to the selected wordline a voltage consistent with reading the selected memory cell.

8. The method of claim 1, further comprising, in a read operation, charging bit-lines in which the selected memory cell is not located to approximately 0 volts.

9. The method of claim 1, further comprising, in a read operation, charging bit-lines in which the selected memory cell is not located to a non-zero bias voltage.

10. The method of claim 9, wherein the non-zero bias voltage is approximately 2 volts.

11. The method of claim 1, further comprising, in a program operation, charging bit-lines in which the selected memory cell is not located to approximately 0 volts.

12. The method of claim 1, further comprising, in a program operation, charging bit-lines in which the selected memory cell is not located to a non-zero bias voltage.

13. The method of claim 12, wherein the non-zero bias voltage is approximately 3 volts.

14. The method of claim 1, wherein a potential between a gate of the memory cell and source and drain regions of the memory cell is no more than approximately 9 volts.

15. The method of claim 1, wherein the memory cell is a multi-bit memory cell.

16. A method of reducing gate disturb in a memory cell, the method comprising:
   providing a plurality of memory cells arranged in an array, wherein a memory cell is selectable by a bit-line and a wordline;
   applying one of read and program bit-line biasing voltages to respective ends of the bitline in which the memory cell is located;
   applying one of a read and a program wordline voltage to the wordline in which the memory cell is located;
   applying a first Vpass voltage to non-selected wordlines on one side of the wordline in which the memory cell is located; and
   applying a second Vpass voltage, different from the first Vpass voltage, to non-selected wordlines on another side of the wordline in which the memory cell is located during one of a read operation and a program operation, and wherein at least one bit line connects at least two drains of memory cells in neighboring rows of the array.

17. The method of claim 16: wherein the first Vpass voltage is higher than the second pass voltage.

18. The method of claim 16, further comprising, in a read operation, charging bit-lines in which the memory cell is not located to approximately 0 volts.

19. The method of claim 16, further comprising, in a read operation, charging bit-lines in which the memory cell is not located to a non-zero bias voltage.

20. The method of claim 19: wherein the non-zero bias voltage is approximately 2 volts.

21. The method of claim 16, further comprising, in a program operation, charging bitlines in which the memory cell is not located to approximately 0 volts.

22. The method of claim 16: further comprising, in a program operation, charging bitlines in which the memory cell is not located to a non-zero bias voltage.

23. The method of claim 22, wherein the non-zero bias voltage is approximately 3 volts.

24. The method of claim 16, wherein a potential between a gate of the memory cell and source and drain regions of the memory cell is no more than approximately 9 volts.

25. The method of claim 16, wherein the memory cell is a multi-bit memory cell.

26. A method of operating an array of charge trapping layer memory cells, the method comprising:
   applying a first Vpass voltage to a non-selected wordline; and
   applying a second Vpass voltage, different from the first Vpass voltage, to another non-selected wordline,
   wherein the non-selected wordline and the another non-selected wordline are on different sides of a selected wordline and the different first and second Vpass voltages are applied during a read operation and a program operation, and wherein at least one bit line connects at least two drains of memory cells in neighboring rows of the array.

27. The method of claim 26, wherein the first Vpass voltage is applied to pass a higher source/drain voltage that is applied to one end of a bit-line in which a selected memory cell is located, while a lower source/drain voltage is applied to another end of the bit line in which the selected memory cell is located.

28. The method of claim 26, wherein the method of operating comprises at least one of reading and programming.

29. The method of claim 26: further comprising, in a read operation, charging bit-lines in which a selected memory cell is not located to approximately 0 volts.

30. The method of claim 26, further comprising, in a read operation, charging bit-lines in which a selected memory cell is not located to a non-zero bias voltage.

31. The method of claim 30, wherein the non-zero bias voltage is approximately 2 volts.

32. The method of claim 26, further comprising, in a program operation, charging bitlines in which a selected memory cell is not located to approximately 0 volts.

33. The method of claim 26, further comprising, in a program operation, charging bitlines in which a selected memory cell is not located to a non-zero bias voltage.

34. The method of claim 33, wherein the non-zero bias voltage is approximately 3 volts.

35. A memory device comprising:
   a plurality of memory cells; and
   a plurality of wordlines and bit lines coupled to the memory cells, and wherein at least one of the memory cells is capable of being selected by a wordline and wherein voltages on non-selected wordlines are different during a read operation and a program operation, and wherein at least one bit line connects at least two drains of memory cells in neighboring rows of the array.

36. The memory device of claim 35, wherein a first set of non-selected wordlines is located on a first side of the selected wordline and a second set of non-selected wordlines is located on a second side of the selected wordline.

37. The memory device of claim 36, where the voltages on the first set of non-selected wordlines are higher than the voltages on the second set of non-selected wordlines.

* * * * *